United States Patent
Bae et al.

(10) Patent No.: US 6,914,301 B2
(45) Date of Patent: *Jul. 5, 2005

(54) CMOS INTEGRATED CIRCUIT DEVICES AND SUBSTRATES HAVING BURIED SILICON GERMANIUM LAYERS THEREIN AND METHODS OF FORMING SAME

(75) Inventors: Geum-jong Bae, Kyungki-do (KR); Tae-hee Choe, Seoul (KR); Sang-su Kim, Kyungki-do (KR); Hwa-sung Rhee, Seoul (KR); Nae-in Lee, Seoul (KR); Kyung-wook Lee, Kyungki-do (KR)

(73) Assignee: Samsung Electronics Co., Ltd. (KR)

(*) Notice: Subject to any disclaimer, the term of this patent is extended or adjusted under 35 U.S.C. 154(b) by 0 days.

This patent is subject to a terminal disclaimer.

(21) Appl. No.: 10/685,116

(22) Filed: Oct. 14, 2003

(65) Prior Publication Data

US 2004/0075143 A1 Apr. 22, 2004

Related U.S. Application Data

(63) Continuation of application No. 09/711,706, filed on Nov. 13, 2000, now Pat. No. 6,633,066.

(30) Foreign Application Priority Data

Jan. 7, 2000 (KR) .......................................... 2000-670

(51) Int. Cl.$^7$ ................................................ H01L 27/01
(52) U.S. Cl. ...................... 257/347; 257/348; 438/149; 438/497
(58) Field of Search .................................. 257/347, 348, 257/350, 190, 12, 183, 616; 438/149, 479, 517

(56) References Cited

U.S. PATENT DOCUMENTS 5,166,084 A  11/1992 Pfiester ........................ 437/40

(Continued)

FOREIGN PATENT DOCUMENTS

JP          9-321307       2/2003     ......... H01L/29/786
WO       WO 97/23000    6/1997

OTHER PUBLICATIONS

Alieu et al., "Multiple SiGe well: a new channel architecture for improving both NMOS and PMOS performances," 2000 Symposium on VLSI Technology Digest of Technology Papers, pp. 130–131.

(Continued)

*Primary Examiner*—Eddie Lee
*Assistant Examiner*—Douglas W. Owens
(74) *Attorney, Agent, or Firm*—Myers Bigel Sibley & Sajovec, P.A.

(57) ABSTRACT

CMOS integrated circuit devices include an electrically insulating layer and an unstrained silicon active layer on the electrically insulating layer. An insulated gate electrode is also provided on a surface of the unstrained silicon active layer. A $Si_{1-x}Ge_x$ layer is also disposed between the electrically insulating layer and the unstrained silicon active layer. The $Si_{1-x}Ge_x$ layer forms a first junction with the unstrained silicon active layer and has a graded concentration of Ge therein that decreases monotonically in a first direction extending from a peak level towards the surface of the unstrained silicon active layer. The peak Ge concentration level is greater than x=0.15 and the concentration of Ge in the $Si_{1-x}Ge_x$ layer varies from the peak level to a level less than about x=0.1 at the first junction. The concentration of Ge at the first junction may be abrupt. More preferably, the concentration of Ge in the $Si_{1-x}Ge_x$ layer varies from the peak level where 0.2<x<0.4 to a level where x=0 at the first junction. The $Si_{1-x}Ge_x$ layer also has a retrograded arsenic doping profile therein relative to the surface. This retrograded profile may result in the $Si_{1-x}Ge_x$ layer having a greater concentration of first conductivity type dopants therein relative to the concentration of first conductivity type dopants in a channel region within the unstrained silicon active layer. The total amount of dopants in the channel region and underlying $Si_{1-x}Ge_x$ layer can also be carefully controlled to achieve a desired threshold voltage.

19 Claims, 9 Drawing Sheets

U.S. PATENT DOCUMENTS

| | | | |
|---|---|---|---|
| 5,218,213 A | 6/1993 | Gaul et al. | 257/55 |
| 5,240,876 A | 8/1993 | Gaul et al. | 437/131 |
| 5,310,451 A | 5/1994 | Tejwani et al. | 156/630 |
| 5,378,923 A | 1/1995 | Mitsui et al. | 257/616 |
| 5,461,243 A * | 10/1995 | Ek et al. | 257/190 |
| 5,461,250 A | 10/1995 | Burghartz et al. | 257/347 |
| 5,527,724 A | 6/1996 | Brady et al. | 437/24 |
| 5,583,059 A | 12/1996 | Burghartz | 437/31 |
| 5,650,340 A * | 7/1997 | Burr et al. | 437/30 |
| 5,698,869 A | 12/1997 | Yoshimi et al. | 257/192 |
| 5,714,777 A | 2/1998 | Ismail et al. | 257/263 |
| 5,726,459 A | 3/1998 | Hsu et al. | 257/55 |
| 5,759,898 A | 6/1998 | Ek et al. | 438/291 |
| 5,767,549 A | 6/1998 | Chen et al. | 257/347 |
| 5,773,328 A | 6/1998 | Blanchard | 438/162 |
| 5,814,854 A | 9/1998 | Liu et al. | 257/315 |
| 5,847,419 A | 12/1998 | Imai et al. | 257/192 |
| 5,882,967 A | 3/1999 | Brown et al. | 458/237 |
| 5,882,987 A | 3/1999 | Srikrishnan | 438/458 |
| 5,891,769 A | 4/1999 | Liaw et al. | 438/167 |
| 5,906,951 A | 5/1999 | Chu et al. | 438/751 |
| 5,930,643 A | 7/1999 | Sadana et al. | 438/407 |
| 5,939,767 A | 8/1999 | Brown et al. | 257/551 |
| 5,962,892 A | 10/1999 | Takeuchi | 257/327 |
| 5,963,817 A | 10/1999 | Chu et al. | 438/410 |
| 6,033,974 A | 3/2000 | Henley et al. | 438/526 |
| 6,048,756 A | 4/2000 | Lee et al. | 438/151 |
| 6,049,110 A | 4/2000 | Koh | 257/347 |
| 6,051,509 A | 4/2000 | Tsuchiaki | 438/758 R |
| 6,059,895 A | 5/2000 | Chu et al. | 148/33.1 |
| 6,111,267 A | 8/2000 | Fischer et al. | 257/19 |
| 6,124,614 A | 9/2000 | Ryum et al. | 257/347 |
| 6,124,627 A | 9/2000 | Rodder et al. | 257/616 |
| 6,287,926 B1 * | 9/2001 | Hu et al. | 438/306 |
| 6,633,066 B1 * | 10/2003 | Bae et al. | 257/347 |

OTHER PUBLICATIONS

Mizuno et al., "High Performance Strained–Si p–MOSFETs on SiGe–on–Insulator Substrates Fabricated by SIMOX Technology," 1999 IEEE, IEDM, pp. 934–936.

Sim et al., "Elimination of Parasitic Bipolar–Induced Breakdown Effects in Ultra–Thin SOI MOSFET's Using Narrow–Bandgap–Source (NBS) Structure," IEEE Transactions on Electron Devices, vol. 42, No. 8, Aug. 1995, pp. 1495–1502.

Yoshimi et al., "Suppression of the Floating–Body Effect in SOI MOSFET's by the Bandgap Engineering Method Using a $Si_{1-x}$–$Ge_x$ Source Structure," IEEE Transactions on Electron Devices, vol. 44, No. 3, Mar. 1997, pp. 423–429.

* cited by examiner

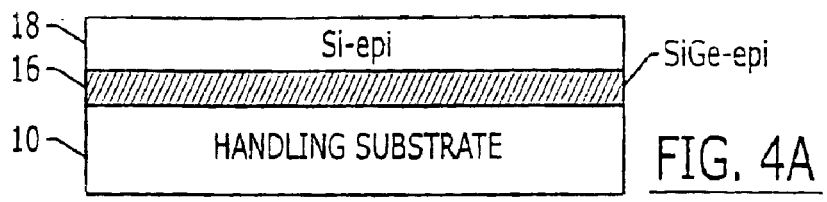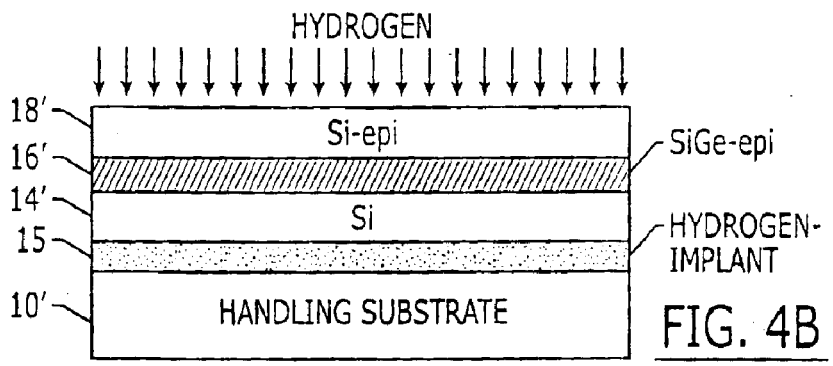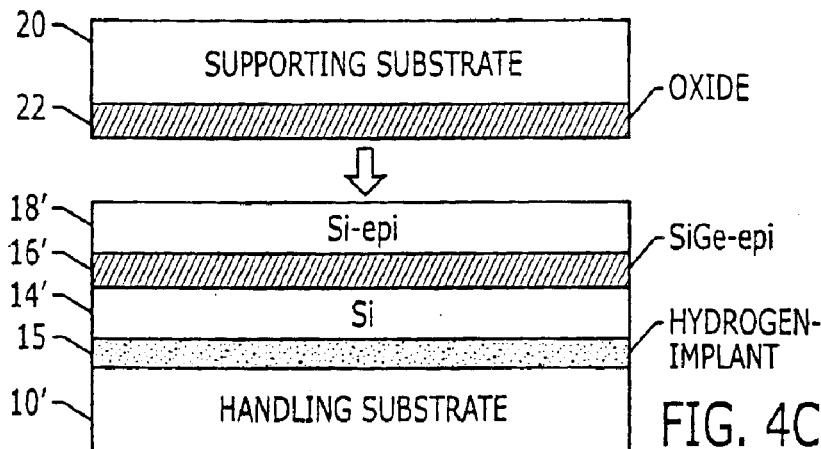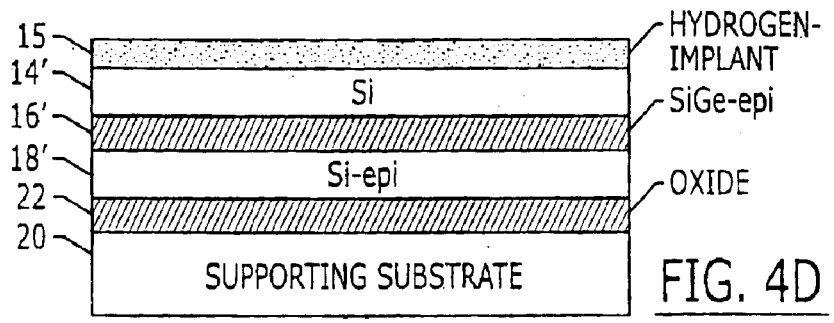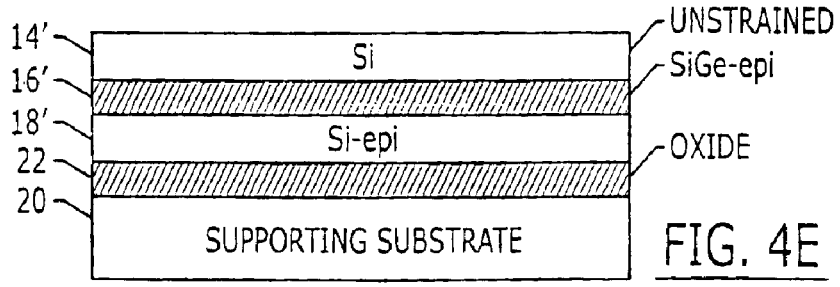

CMOS INTEGRATED CIRCUIT DEVICES AND SUBSTRATES HAVING BURIED SILICON GERMANIUM LAYERS THEREIN AND METHODS OF FORMING SAME

RELATED APPLICATION

This application is a continuation of application Ser. No. 09/711,706, filed Nov. 13, 2000 now U.S. Pat. No. 6,633,066 which claimed priority to Korean Patent Application No. 2000-670, filed Jan. 7, 2000, the disclosures of which are hereby incorporated herein by reference.

FIELD OF THE INVENTION

The present invention relates to semiconductor devices and fabrication methods, and more particularly, to MOS-based semiconductor devices and substrates and methods of forming same.

BACKGROUND OF THE INVENTION

Partially-depleted silicon-on-insulator (PDSOI) MOSFETs offer high speed and low power performance, but typically remain susceptible to parasitic floating body effects (FBE) which can seriously degrade device performance. Various techniques have been proposed for reducing FBE in SO MOSFETs. One such technique includes using a narrow bandgap SiGe layer adjacent a source of an SOI NMOS field effect transistor. As will be understood by those skilled in the art, the use of a SiGe layer reduces the potential barrier for holes passing from the body region to the source region. Therefore, holes generated in the body region by impact ionization can more readily flow into the source region through the path of the p-Si(body)/n+SiGe(source)/n+Si (source). This and other related techniques are disclosed in articles by J. Sim et al. entitled "Elimination of Parasitic Bipolar-Induced Breakdown Effects in Ultra-Thin SOI MOSFETs Using Narrow-Bandgap-Source (NBS) Structure," IEEE Trans. Elec. Dev., Vol. 42, No. 8, pp. 1495–1502, August (1995) and M. Yoshimi et al. entitled "Suppression of the Floating-Body Effect in SOI MOSFETs by the Bandgap Engineering Method Using a $Si_{1-x}Ge_x$ Source Structure," IEEE Trans. Elec. Dev., Vol. 44, No. 3, pp. 423–429, March (1997). U.S. Pat. No. 5,698,869 to Yoshimi et al. entitled "Insulated-Gate Transistor Having Narrow-Bandgap-Source" also discloses the use of a narrow bandgap material within a source region of a MOSFET.

Techniques to reduce FBE and improve channel characteristics in MOSFETs are also described in U.S. Pat. No. 5,891,769 to Liaw et al. entitled "Method for Forming a Semiconductor Device Having a Heteroepitaxial Layer." In particular, the '769 patent discloses the use of a strained channel region to enhance carrier mobility within MOSFETs. This strained channel region may be formed by growing a silicon layer on an as-grown relaxed or unstrained SiGe layer. U.S. Pat. No. 5,963,817 to Chu et al. entitled "Bulk and Strained Silicon on Insulator Using Selective Oxidation," also discloses the use of SiGe layers, which selectively oxidize at faster rates relative to silicon, to improve FBE. Furthermore, U.S. Pat. Nos. 5,906,951 and 6,059,895 to Chu et al. disclose wafer bonding techniques and strained SiGe layers to provide SOI substrates. The use of wafer bonding techniques and SiGe layers to provide SOI substrates are also described in U.S. Pat. Nos. 5,218,213 and 5,240,876 to Gaul et al. Conventional techniques for forming SOI substrates are also illustrated by FIGS. 1A–1D and 2A–2D. In particular, FIG. 1A illustrates the formation of a handling substrate having a porous silicon layer therein and an epitaxial silicon layer thereon and FIG. 1B illustrates the bonding of a supporting substrate to a surface of the epitaxial silicon layer. The supporting substrate may include an oxide layer thereon which is bonded directly to the epitaxial silicon layer using conventional techniques. As illustrated by FIG. 1C, a portion of the handling substrate is then removed to expose the porous silicon layer. This removal step may be performed by grinding or etching away a portion of the handling substrate or splitting the porous silicon layer. As illustrated by FIG. 1D, a conventional planarization technique may then be performed to remove the porous silicon layer and provide an SOI substrate having a polished silicon layer thereon and a buried oxide layer therein. The conventional technique illustrated by FIGS. 1A–1D is commonly referred to as an epi-layer transfer (ELTRAN) technique. FIG. 2A illustrates a step of forming a handling substrate having a silicon layer thereon by implanting hydrogen ions into a surface of the substrate to define a buried hydrogen implant layer therein. Then, as illustrated by FIG. 2B, a supporting substrate is bonded to the handling substrate. A portion of the handling substrate is then removed by splitting the bonded substrate along the hydrogen implant layer, as illustrated by FIG. 2C. A conventional planarization technique may then be performed to remove the hydrogen implant layer, as illustrated by FIG. 2D. The conventional technique illustrated by FIGS. 2A–2D is commonly referred to as a "smart-cut" technique.

Unfortunately, although the use of strained silicon channel regions may enhance carrier mobility in both NMOS and PMOS devices, such strained regions typically degrade short channel device characteristics. Thus, notwithstanding the above-described techniques for forming MOSFETs and SOI substrates, there continues to be a need for improved methods of forming these structures that do not require the use of strained channel regions to obtain enhanced channel mobility characteristics, and structures formed thereby.

SUMMARY OF THE INVENTION

Embodiments of the present invention include semiconductor-on-insulator (SOI) substrates having buried $Si_{1-x}Ge_x$ layers therein. A SOI substrate according to one embodiment of the present invention comprises a silicon wafer having an electrically insulating layer thereon and a $Si_{1-x}Ge_x$ layer having a graded concentration of Ge therein extending on the electrically insulating layer. An unstrained silicon active layer is also provided in the SOI substrate. This unstrained silicon active layer extends on the $Si_{1-x}Ge_x$ layer and forms a junction therewith. The unstrained silicon active layer also preferably extends to a surface of the SOI substrate, so that integrated circuit devices may be formed at the surface of the silicon active layer. To facilitate the use of relatively thin silicon active layers, the $Si_{1-x}Ge_x$ layer is preferably epitaxially grown from the unstrained silicon active layer. This epitaxial growth step may include providing an unstrained silicon active layer (or initially epitaxially growing an unstrained silicon active layer on a substrate) and then continuing growth of a $Si_{1-x}Ge_x$ layer on the active layer by increasing the concentration of Ge in a graded manner until a maximum desired Ge concentration is obtained. Further growth may then occur by reducing the concentration of Ge in a graded manner back to x=0. The grading of Ge in the $Si_{1-x}Ge_x$ layer may constitute a linear grading.

The preferred SOI substrates may be fabricated by initially forming a handling substrate having an unstrained silicon layer therein and a $Si_{1-x}Ge_x$ layer extending on the silicon layer. A supporting substrate is then bonded to the handing substrate so that the $Si_{1-x}Ge_x$ layer is disposed between the supporting substrate and the unstrained silicon layer. A portion of the handling substrate is then preferably removed from the supporting substrate to expose a surface of the silicon layer and define a semiconductor-on-insulator substrate having a buried $Si_{1-x}Ge_x$ layer therein. Here, the buried $Si_{1-x}Ge_x$ layer preferably has a graded concentration of Ge therein with a profile that decreases in a direction that extends from the supporting substrate to the surface of the silicon layer.

These methods may also include forming a handling substrate having an unstrained first silicon layer therein, a $Si_{1-x}Ge_x$ layer extending on the first silicon layer and an unstrained or strained second silicon layer extending on the $Si_{1-x}Ge_x$ layer. The bonding step may also be preceded by the step of thermally oxidizing the second silicon layer to define a thermal oxide layer on the $Si_{1-x}Ge_x$. The supporting substrate may also comprise an oxide surface layer thereon and the bonding step may comprise bonding the oxide surface layer to the thermal oxide layer. Alternatively, the bonding step may be preceded by the step of depositing an electrically insulating layer on the $Si_{1-x}Ge_x$ layer and the bonding step may comprise bonding the oxide surface layer to the electrically insulating layer.

According to still another preferred method of forming a SOI substrate, the handling substrate may comprise a porous silicon layer therein and the removing step may comprise removing a portion of the handling substrate from the supporting substrate by splitting the porous silicon layer and then planarizing the porous silicon layer and the silicon layer in sequence. Preferred methods of forming handling substrates may also comprise epitaxially growing a $Si_{1-x}Ge_x$ layer on a silicon layer and then implanting hydrogen ions through the $Si_{1-x}Ge_x$ layer and the silicon layer to define a hydrogen implant layer in the handling substrate. The removing step may then be performed by splitting the hydrogen implant layer and then planarizing the hydrogen implant layer to expose a surface of the silicon layer. Semiconductor devices, including field effect transistors, may then be formed at this surface of the silicon layer.

An additional embodiment of the present invention includes semiconductor-on-insulator field effect transistors. Such transistors may comprise an electrically insulating layer and an unstrained silicon active layer on the electrically insulating layer. An insulated gate electrode is also provided on a surface of the unstrained silicon active layer. A $Si_{1-x}Ge_x$ layer is also disposed between the electrically insulating layer and the unstrained silicon active layer. The $Si_{1-x}Ge_x$ layer forms a first junction with the unstrained silicon active layer and has a graded concentration of Ge therein that decreases monotonically in a first direction extending from a peak level towards the surface of the unstrained silicon active layer. According to one aspect of this embodiment, the peak Ge concentration level is greater than x=0.15 and the concentration of Ge in the $Si_{1-x}Ge_x$ layer varies from the peak level to a level less than about x=0.1 at the first junction. The concentration of Ge at the first junction may be abrupt. More preferably, the concentration of Ge in the $Si_{1-x}Ge_x$ layer varies from the peak level where 0.2<x<0.4 to a level where x=0 at the first junction.

The $Si_{1-x}Ge_x$ layer may also define an interface with the underlying electrically insulating layer and the graded concentration of Ge in the $Si_{1-x}Ge_x$ layer may increase from a level less than about x=0.1 at the interface with the electrically insulating layer to the peak level. The unstrained silicon active layer may also have a thickness of greater than about 600 Å and the $Si_{1-x}Ge_x$ layer may have a thickness of less than about 800 Å.

Higher drive current capability in PMOS transistors may also be achieved by reorganizing the dopant profiles in the channel region and in the body region. In particular, the different solubility of certain dopants in Si and $Si_{1-x}Ge_x$ can be used advantageously to improve PMOS device characteristics. In a preferred PMOS transistor, the $Si_{1-x}Ge_x$ layer is doped with an N-type dopant and the concentration of the N-type dopant in the $Si_{1-x}Ge_x$ layer has a profile that decreases in the first direction towards the surface of the unstrained silicon active layer. This profile preferably has a peak level within the $Si_{1-x}Ge_x$ layer and may decrease in the first direction and in a monotonic manner so that a continuously retrograded N-type dopant profile extends across the unstrained silicon active layer. This N-type dopant is preferably used to suppress punch-through in the body region, but may also be used to influence the threshold voltage of the PMOS transistor.

Additional semiconductor-on-insulator field effect transistors may also comprise an electrically insulating layer and a composite semiconductor active region on the electrically insulating layer. This composite semiconductor active region comprises a silicon active layer having a thickness greater than about 600□ and a single $Si_{1-x}Ge_x$ layer disposed between the electrically insulating layer and the silicon active layer. The $Si_{1-x}Ge_x$ layer forms a first junction with the silicon active layer and has a graded concentration of Ge therein that decreases monotonically in a first direction extending from a peak level towards a surface of the silicon active layer. An insulated gate electrode is also provided on the surface. The peak level of Ge in the $Si_{1-x}Ge_x$ layer is preferably greater than x=0.15 and the concentration of Ge in the $Si_{1-x}Ge_x$ layer varies from the peak level to a level less than about x=0.1 at the first junction. More preferably, the concentration of Ge in the $Si_{1-x}Ge_x$ layer varies from the peak level where 0.2<x<0.4 to a level where x=0 at the first junction. The $Si_{1-x}Ge_x$ layer may also define an interface with the electrically insulating layer and the graded concentration of Ge in the $Si_{1-x}Ge_x$ layer also increases from a level less than about x=0.1 at the interface to the peak level.

A further embodiment of the present invention comprises a PMOS field effect transistor having a composite semiconductor active region therein that extends on an electrically insulating layer. This composite semiconductor active region comprises a single $Si_{1-x}Ge_x$ layer having a graded concentration of Ge therein that decreases monotonically in a first direction extending from a peak level within the single $Si_{1-x}Ge_x$ layer towards a surface thereof. An unstrained silicon active layer is also provided that extends from a first junction with the single $Si_{1-x}Ge_x$ layer to the surface. The composite semiconductor active region also has an at least substantially retrograded N-type dopant profile therein that extends to the surface and has a peak level in the single $Si_{1-x}Ge_x$ layer. The total charge provided by this N-type dopant influences the threshold voltage of the PMOS transistor. The N-type dopant in the single $Si_{1-x}Ge_x$ layer also significantly inhibits punch-through caused by depletion layers that may extend between the source and drain regions. Lightly doped P-type source and drain regions are also preferably provided. These regions extend in the silicon active layer and opposite the insulated gate electrode. A source-side pocket implant region of N-type conductivity is also provided and this pocket implant region extends between the lightly doped P-type source region and the single $Si_{1-x}Ge_x$ layer. This pocket implant region forms rectifying and nonrectifying junctions with the source region and the single $Si_{1-x}Ge_x$ layer, respectively, and operates to suppress junction leakage.

A still further embodiment of a semiconductor-on-insulator field effect transistor comprises a bulk silicon region and an electrically insulating layer on the bulk silicon region. An unstrained silicon active layer having a first thickness is also provided on the electrically insulating layer and an insulated gate electrode with sidewall insulating spacers is formed on a surface of the unstrained silicon active layer. A $Si_{1-x}Ge_x$ layer of first conductivity type is disposed between the electrically insulating layer and the unstrained silicon active layer. In particular, the $Si_{1-x}Ge_x$ layer forms a first junction with the unstrained silicon active layer and has a graded concentration of Ge therein that decreases monotonically in a first direction extending from a peak level towards the surface. Lightly doped source and drain regions of second conductivity type are also provided. These lightly doped regions extend in the unstrained silicon active layer, but to a depth less than the thickness of the unstrained silicon active layer. In addition, a source-side pocket implant region of first conductivity type is provided in the unstrained silicon active layer, and this source-side pocket implant region extends between the lightly doped source region and the $Si_{1-x}Ge_x$ layer. According to a preferred aspect of this embodiment, the $Si_{1-x}Ge_x$ layer has a retrograded first conductivity type doping profile therein relative to the surface. This retrograded first conductivity type doping profile may be a retrograded arsenic (or arsenic/phosphorus) doping profile and may result in the $Si_{1-x}Ge_x$ layer having a greater concentration of first conductivity type dopants therein relative to the maximum concentration of first conductivity type dopants in a channel region within the unstrained silicon active layer. In particular, the retrograded dopant profile has a peak in the $Si_{1-x}Ge_x$ layer and a minimum underneath the gate electrode. This retrograded profile preferably decreases monotonically from the peak level to the minimum level, however, other retrograded profiles may also be achieved. The thickness of the unstrained silicon active layer and the total amount of dopants in the channel region and underlying $Si_{1-x}Ge_x$ layer can also be carefully controlled to achieve a desired threshold voltage and inhibit punch-through.

Embodiments of the present invention also include methods of forming field effect transistors by forming an insulated gate electrode on a surface of a semiconductor-on-insulator substrate. This substrate includes an electrically insulating layer, an unstrained silicon active layer on the electrically insulating layer and a $Si_{1-x}Ge_x$ epitaxial layer having a graded concentration of Ge therein disposed between the electrically insulating layer and the unstrained silicon active layer. Steps are also performed to form source and drain regions of first conductivity type in the unstrained silicon active layer and also form source-side and drain-side pocket implant regions of second conductivity type that extend in the unstrained silicon active layer and in the $Si_{1-x}Ge_x$ epitaxial layer. These pocket implant regions form respective P-N junctions with the source and drain regions. The step of forming an insulated gate electrode is preferably preceded by the step of implanting threshold voltage control dopants of first conductivity type into the unstrained silicon active layer. These threshold voltage control dopants may then be annealed and redistributed as a result of different dopant solubility in Si and $Si_{1-x}Ge_x$, after the insulated gate electrode has been formed, to establish a retrograded profile of threshold voltage control dopants in the $Si_{1-x}Ge_x$ epitaxial layer and silicon active layer. The dopants in the $Si_{1-x}Ge_x$ epitaxial layer also inhibit punch-through in PMOS devices and reduce floating body effects in NMOS devices.

The substrates and forming methods of the present invention can be utilized to form NMOS transistors having reduced floating body effects (FBE). The reduction in FBE occurs because the buried SiGe layer, having a graded Ge concentration therein, reduces the potential barrier for holes passing from the body region to the source region. Therefore, holes generated in the body region by impact ionization can more readily flow into the source region through the path of the p-Si(body)/p-SiGe(body)/n+SiGe (source)/n+Si(source). NMOS transistors having well controlled kink effect characteristics and Id v. Vg curves having evenly distributed subthreshold slope with respect to Vds can also be formed. The substrates and forming methods of the present invention can also be utilized to provide PMOS transistors having excellent drive capability resulting from higher inversion-layer carrier mobility in the channel regions. This improved drive capability is achieved by reorganizing the channel region dopants through annealing so that a retrograded dopant profile and a desired threshold voltage are simultaneously achieved. This reorganization of the channel region dopants can also be used to enhance pocket ion implantation efficiency. The threshold voltage roll-off characteristics of these NMOS and PMOS devices can also demonstrate reduced short channel effects (RSCE), and the suppressed parasitic bipolar action (PBA) in the devices can be used to reduce off-leakage current.

BRIEF DESCRIPTION OF THE DRAWINGS

The above objectives and advantages of the present invention will become more apparent by describing in detail a preferred embodiment thereof with reference to the attached drawings in which:

FIGS. 4A–4E are cross-sectional views of intermediate structures that illustrate methods of forming SOI substrates having SiGe layers therein according to an embodiment of the present invention.

DESCRIPTION OF PREFERRED EMBODIMENTS

Figure 1A:
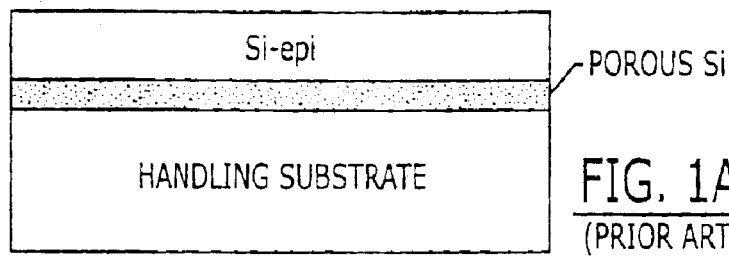
FIGS. 1A–1D are cross-sectional views of intermediate structures that illustrate conventional methods of forming semiconductor-on-insulator (SOI) substrates.
Figure 1B:
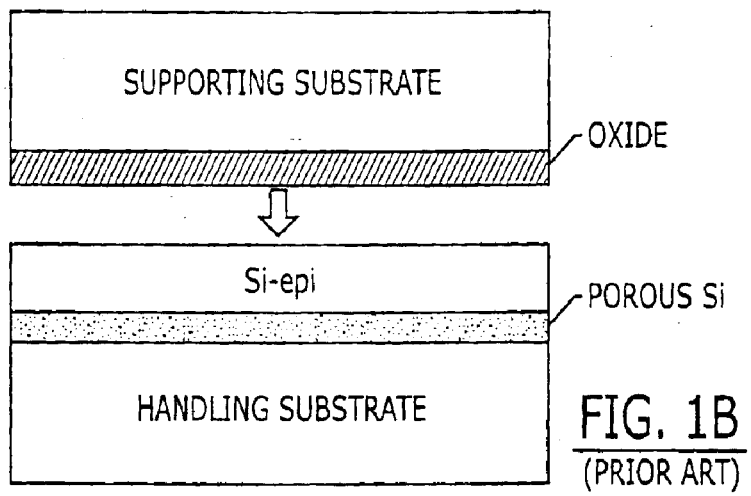
Figure 1C:
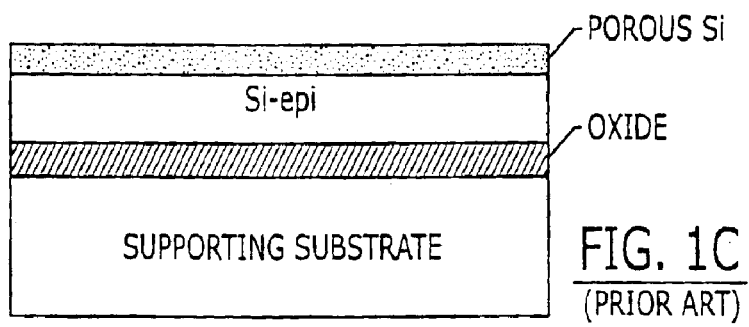
Figure 1D:
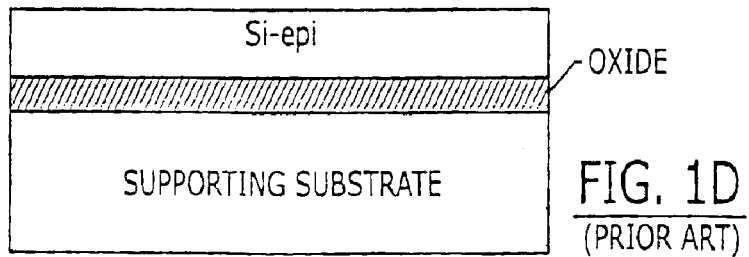
Figure 2A:
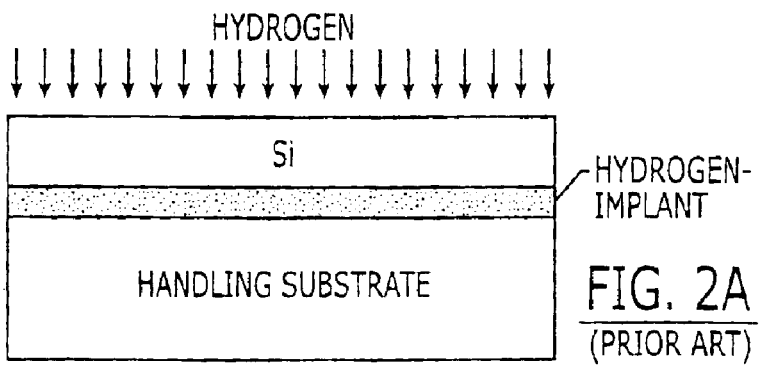
FIGS. 2A–2D are cross-sectional views of intermediate structures that illustrate conventional methods of forming SOI substrates.
Figure 2B:
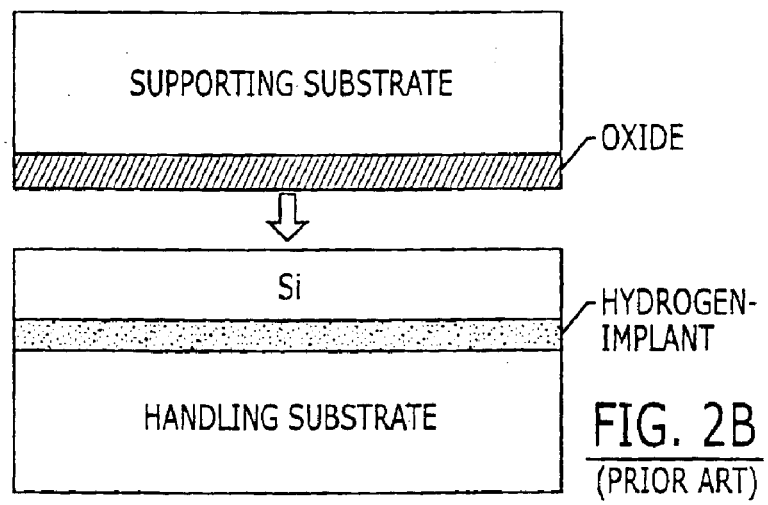
Figure 2C:
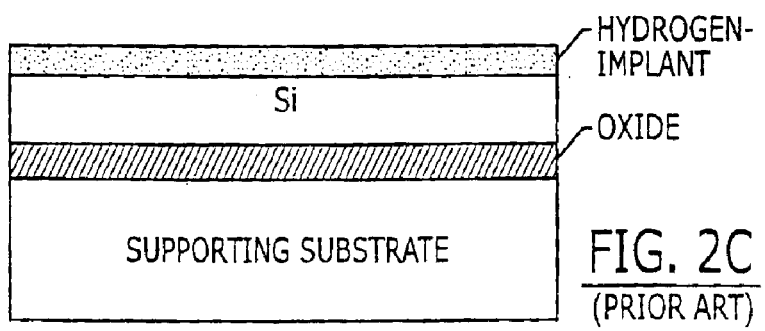
Figure 2D:
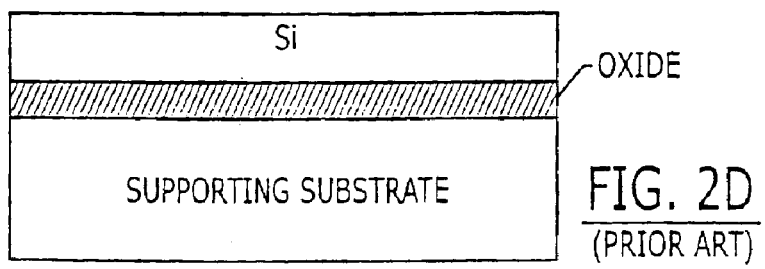

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 3A:
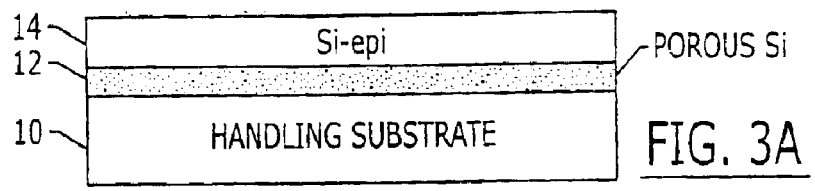
FIGS. 3A–3E are cross-sectional views of intermediate structures that illustrate methods of forming SOI substrates having SiGe layers therein according to an embodiment of the present invention.
Figure 3B:
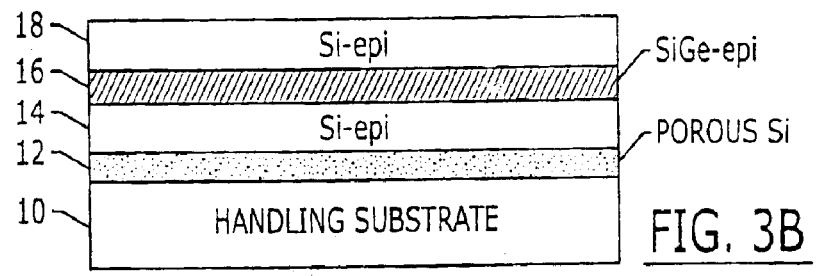

Referring now to FIGS. 3A–3E, preferred methods of forming semiconductor-on-insulator (SOI) substrates having $Si_{1-x}Ge_x$ layers therein will be described. As illustrated by FIG. 3A, an illustrated method includes forming a handling substrate 10 having a porous silicon layer 12 therein and a first epitaxial silicon layer 14 (Si-epi) extending on the porous silicon layer 12. This first epitaxial silicon layer 14 may have a thickness of greater than about 600 Å. As illustrated by FIG. 3B, a $Si_{1-x}Ge_x$ layer 16 is then formed on the first epitaxial silicon layer 14. This $Si_{1-x}Ge_x$ layer 16 may have a thickness of less than about 800 Å and may be formed using a low pressure chemical vapor deposition technique (LPCVD) that is performed at a temperature in a range between about 700° C. and 1300° C. This deposition step may be performed by exposing a surface of the first epitaxial silicon layer 14 to a deposition gas comprising a mixture of $GeH_4$ and $SiH_2Cl_2$ source gases. In particular, the deposition step is preferably performed by varying the relative concentration of the germanium source gas (e.g., $GeH_4$) in-situ. For example, the flow rate of the germanium source gas is preferably varied so that the concentration of Ge within the $Si_{1-x}Ge_x$ layer 16 is increased from a value of x=0.0 at the junction with the underlying first epitaxial silicon layer 14 to a maximum value of 0.2×0.4 therein.

After the maximum concentration level is reached, the flow rate of the germanium source gas may be gradually reduced until the concentration of Ge in the $Si_{1-x}Ge_x$ layer 16 is reduced to zero.

Referring still to FIG. 3B, a second epitaxial silicon layer 18 may then be formed on the Si, Ge, layer 16 by continuing the deposition step using a source gas of $SiH_2Cl_2$ at a temperature of about 850° C. This step of forming a second epitaxial silicon layer 18 is optional.

Figure 3C:
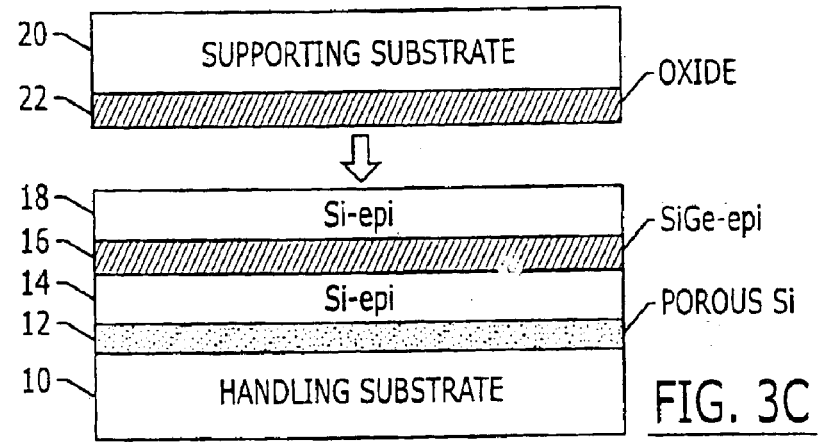
Figure 3D:
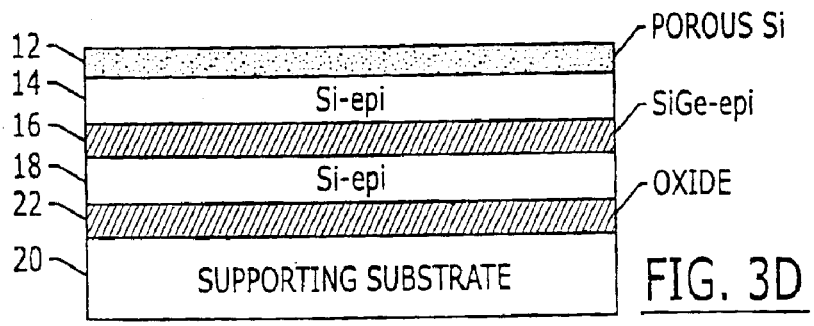
Figure 3E:
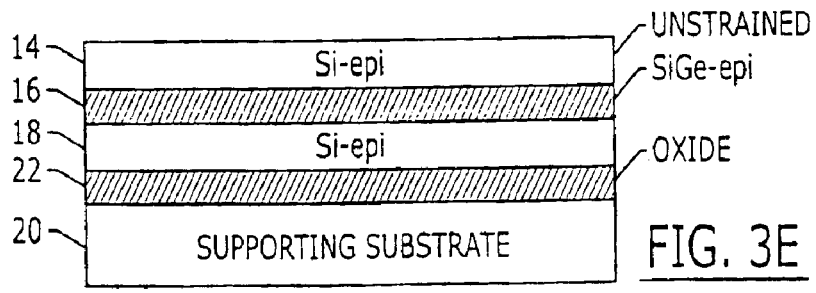

Referring now to FIG. 3C, a supporting substrate 20 is then preferably bonded to the second epitaxial silicon layer 18. As illustrated, this bonding step is preferably performed between an oxide layer 22 residing on the supporting substrate 20 and a polished surface of the second epitaxial silicon layer 18. The oxide layer 22 may have a thickness in a range between about 800–3000 Å. Then, as illustrated by FIG. 3D, the handling substrate 10 is removed from the composite substrate by splitting the composite substrate along the porous silicon layer 12. Conventional techniques may then be used to remove remaining portions of the porous silicon layer 12 from the composite substrate. As illustrated by FIG. 3E, this removal step may comprise removing the porous silicon layer 12 using a planarization or polishing technique that exposes a primary surface 14a of the first epitaxial silicon layer 14. As described more fully hereinbelow, active devices (e.g., CMOS devices) having preferred electrical characteristics may be formed in the first "unstrained" epitaxial silicon layer 14.

FIGS. 4A–4E illustrate alternative methods of forming semiconductor-on-insulator (SOI) substrates having $Si_{1-x}Ge_x$ layers therein. As illustrated by FIG. 4A, an illustrated method includes forming a handling substrate 10' having a $Si_{1-x}Ge_x$ layer 16' thereon and a second epitaxial silicon layer 18' on the $Si_{1-x}Ge_x$ layer 16'. The $Si_{1-x}Ge_x$ layer 16' may be formed as described above with respect to FIG. 3B. A blanket implantation step is then performed, as illustrated by FIG. 4B. This implantation step may include implanting hydrogen ions through the second epitaxial silicon layer 18' and into the handling substrate 10', to define a hydrogen implant layer 15. The hydrogen ions are preferably implanted at a sufficient energy level to define a first silicon layer 14' between the hydrogen implant layer 15 and the $Si_{1-x}Ge_x$ layer 16'. For example, the hydrogen ions may be implanted at a dose level of $1\times10^{16}$–$1\times10^{17}$ cm$^2$ and at an energy level of about 150–400 KeV. Referring now to FIG. 4C, a supporting substrate 20 is then preferably bonded to the second epitaxial silicon layer 18'. As illustrated, this bonding step is preferably performed between an oxide layer 22 residing on the supporting substrate 20 and a polished surface of the second epitaxial silicon layer 18'. Then, as illustrated by FIG. 4D, the handling substrate 10' is removed from the composite substrate by splitting the composite substrate along the hydrogen implant layer 15. Conventional techniques may then be used to remove remaining portions of the hydrogen implant layer 15 from the composite substrate.

As illustrated by FIG. 4E, this removal step may comprise removing the hydrogen implant layer 15 using a planarization or polishing technique that exposes a primary surface of the first silicon layer 14'. According to still further embodiments of the present invention, the second epitaxial silicon layer 18 of FIG. 3C and the second epitaxial silicon layer 18' of FIG. 4C may be thermally oxidized before the bonding step is performed. Alternatively, prior to the bonding step, an electrically insulating layer may be deposited on the second epitaxial silicon layers 18 and 18', or on the $Si_{1-x}Ge_x$ layers 16 and 16' in the event the second epitaxial silicon layers 18 and 18' are not present. The thickness of the $Si_{1-x}Ge_x$ layers 16 and 16' may also be increased in the event these layers are partially thermally oxidized in preparation for the bonding step. The thicknesses of the second epitaxial silicon layers 18 and 18' may be set at levels in a range between about 200–400 Å.

Alternatively, the $Si_{1-x}Ge_x$ layers 16 and 16' may be formed as layers having a graded concentration of Ge therein that reaches a maximum level of about 30 percent. These layers may be formed at a temperature in a range between 700° C.–800° C. and at a pressure of about 20 Torr. The source gases may include $GeH_4$, (0–60 sccm), DCS ($SiH_2Cl_2$) at 200 sccm and HCl at 50–100 sccm.

Figure 5:
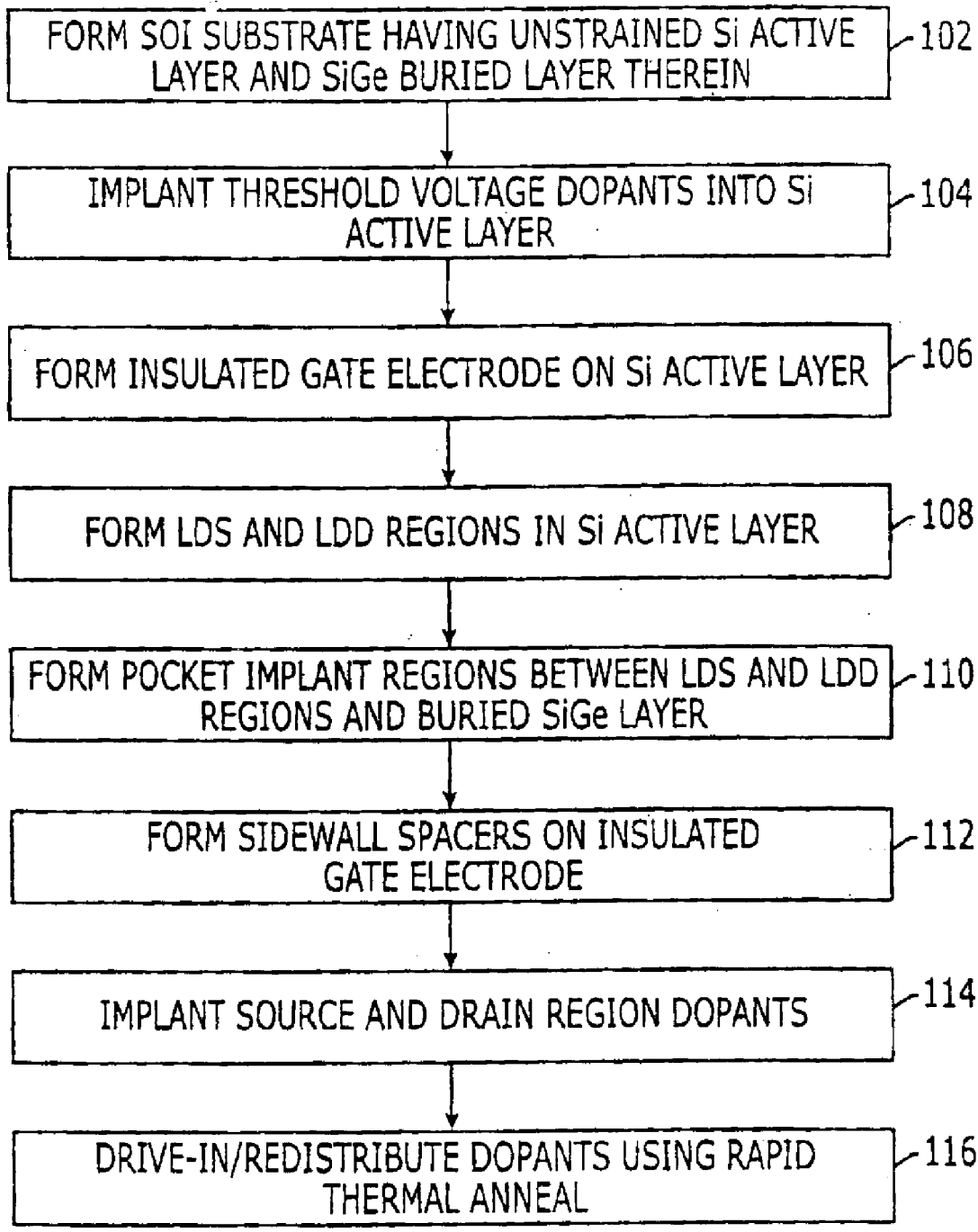
FIG. 5 is a flow-diagram of process steps that illustrates preferred methods of forming SOI-based field effect transistors according to an embodiment of the present invention.

Referring now to FIG. 5, preferred methods 100 of forming field effect transistors (e.g., MOSFETs) in SOI substrates will be described. As described above with respect to FIGS. 3A–3E and 4A–4E, these methods include forming an SOI substrate having an unstrained silicon active layer and a buried $Si_{1-x}Ge_x$ layer therein, Block 102. The buried $Si_{1-x}Ge_x$ layer is preferably epitaxially grown from the unstrained silicon active layer while the concentration of Ge therein is increased from a level where initially x=0 to a peak level where 0.2×0.4. Thus, the concentration of Ge in the buried $Si_{1-x}Ge_x$ layer has a profile that preferably decreases in a direction extending from a peak level therein towards a primary surface of the unstrained silicon active layer (i.e., upper surface of the SOI substrate). Dopants for adjusting threshold voltage are then implanted into the substrate, Block 104. The "threshold voltage" dopants used in NMOS and PMOS transistors may be separately implanted into the substrate using respective NMOS and PMOS implant masks. For NMOS transistors, the threshold voltage dopants typically comprise P-type dopants such as boron (B) and indium (In). However, for PMOS transistors, the threshold voltage dopants typically comprise N-type dopants such as arsenic (As) and phosphorus (P).

The steps of implanting threshold voltage dopants may include implanting multiple different dopants of same conductivity type. For example, in PMOS devices, both As and P dopants may be implanted as threshold voltage dopants at respective energy levels and dose levels. These multiple dopants may have different dopant solubilities within silicon and silicon germanium and these different solubilities may be used advantageously to achieve a preferred redistribution of the threshold voltage dopants when subsequent thermal annealing steps are performed. This preferred redistribution may result in a retrograded profile of the threshold voltage dopants. In particular, the preferred redistribution of dopants may improve the inversion-layer channel characteristics of the resulting transistors by inhibiting a reduction in channel mobility that typically occurs when threshold voltage dopants are introduced into the channel regions of the transistors. This is particularly advantageous for PMOS devices which typically suffer from relatively low hole mobility in the inversion-layer channel. The thickness of the silicon active layer and underlying $Si_{1-x}Ge_x$ layer may also be designed to enhance the degree of preferred redistribution of the threshold voltage dopants while simultaneously insuring that the total dopant charge influences the resulting threshold voltage. The dopants used to influence threshold voltage in PMOS devices may also be used advantageously to inhibit punch-through.

Referring now to Block 106, an insulated gate electrode may then be formed on the substrate using conventional techniques. As illustrated by Block 108, this insulated gate electrode is then used as a mask during the implantation of lightly doped source (LDS) and lightly doped drain (LDD) dopants into the unstrained silicon active layer. Pocket implant regions may then be formed by implanting pocket region dopants into the unstrained silicon active layer and underlying $Si_{1-x}Ge_x$ layer, Block 110. These pocket region dopants are preferably implanted at a sufficient dose level and energy level to result in the formation of pocket implant regions that extend between the LDS and LDD regions and the underlying $Si_{1-x}Ge_x$ layer. As illustrated by Block 112, conventional techniques may then be used to define electrically insulating spacers on the sidewalls of the gate electrode. Highly doped source and drain region dopants may then be implanted into and through the LDS and LDD regions, using the gate electrode and sidewall insulating spacers as an implant mask, Block 114. As illustrated by Block 116, a rapid thermal annealing (RTA) step may then be performed to drive-in the source and drain region dopants. During this annealing step, previously implanted dopants may also be diffused and redistributed within the silicon active layer and underlying $Si_{1-x}Ge_x$ layer.

Figure 6A:
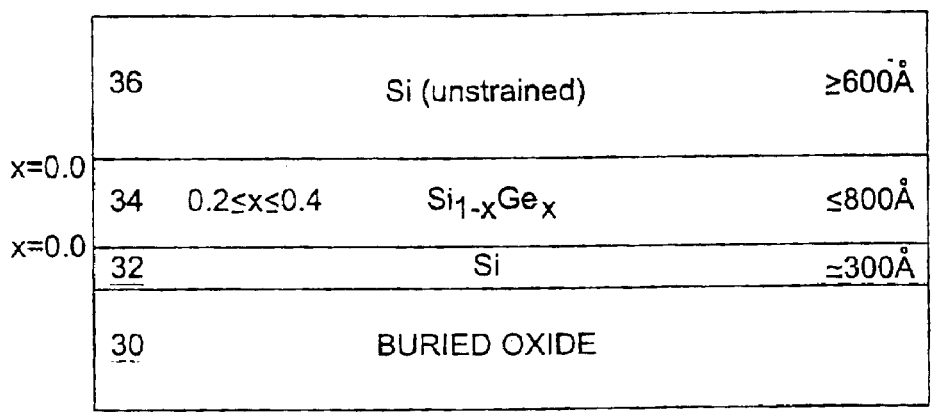
FIGS. 6A–6E are cross-sectional views of intermediate structures that illustrate methods of forming SOI-based MOS transistors according to an embodiment of the present invention.

Referring now to FIGS. 6A–6E, preferred methods of forming SOI field effect transistors include forming a substrate having an unstrained silicon active layer 36 thereon and a buried $Si_{1-x}Ge_x$ layer 34 therein. As illustrated by FIG. 6A, the unstrained silicon active layer 36 may have a thickness of greater than about 600 Å and the buried $Si_{1-x}Ge_x$ layer 34 may have a thickness of less than about 800 Å. Preferably, the unstrained silicon active layer 36 may have a thickness in a range between about 800 Å and 1200 Å and the buried $Si_{1-x}Ge_x$ layer 34 may have a thickness in a range between about 200 Å and 600 Å. More preferably, the unstrained silicon active layer 36 may have a thickness of 1000 Å and the buried $Si_{1-x}Ge_x$ layer 34 may have a thickness of 400 Å. A relatively thin underlying layer 32 of strained or unstrained silicon having a thickness of about 300 Å may also be provided between the buried $Si_{1-x}Ge_x$ layer 34 and a buried oxide layer 30. This underlying layer 32 may be omitted. The concentration of Ge in the buried $Si_{1-x}Ge_x$ layer 34 may be set to zero at the junction with the silicon active layer 36 and the underlying layer 32. The concentration of Ge in the buried $Si_{1-x}Ge_x$ layer 34 may also be set at a peak level in a range between 0.2 and 0.4 and may be linearly graded relative to the peak level. The buried oxide layer 30 may be provided on a semiconductor substrate or wafer (not shown).

Figure 6B:
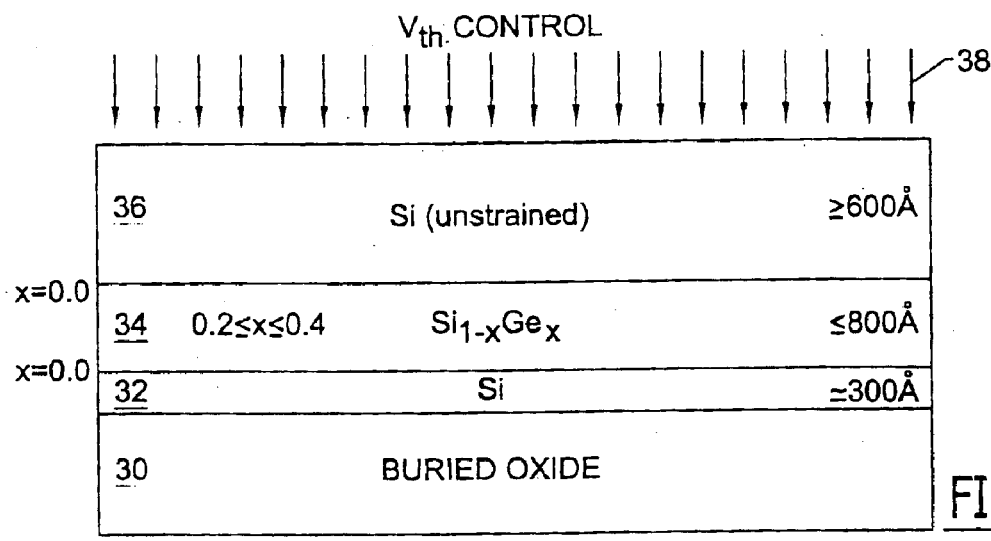

Referring now to FIG. 6B, threshold voltage control dopants 38 are then implanted into the unstrained silicon active layer 36. In the event both NMOS and PMOS devices are to be formed at adjacent locations within the silicon active layer 36, then separate NMOS and PMOS implantation masks (not shown) may be formed on the unstrained silicon active layer 36. These masks may be used when N-type dopants are implanted as threshold voltage control dopants for PMOS devices and when P-type dopants are implanted as threshold voltage control dopants for NMOS devices. The implanted dopants 38 may include boron (B) and indium (In) when forming NMOS devices and arsenic (As) and phosphorus (P) when forming PMOS devices. Other dopants may also be used. In particular, the illustrated implanting step may comprise two separate implant steps. First, threshold voltage control dopants such as $BF_2$ ions may be implanted at an energy level in a range between about 30–60 KeV, at a dose level in a range between about $8\times10^{11}$ cm$^{-2}$ and $5\times10^{13}$ cm$^{-2}$ and at a tilt angle of 0°. Second, threshold voltage control dopants such as indium ions may also be implanted at a higher energy level in a range between about 150–250 KeV and at a dose level in a range between about $8\times10^{11}$ cm$^{-2}$ and $5\times10^{13}$ cm$^{-2}$. When forming PMOS devices, the illustrated implanting step may comprise separately implanting arsenic and phosphorous ions at sufficient dose and energy levels to achieve a desired retrograded dopant profile within the channel region and body region within the silicon active layer 36 and the underlying $Si_{1-x}Ge_x$ layer 34. In particular, the first implant step may comprise implanting P ions at an energy level in a range between about 20–40 KeV, at a dose level in a range between about $8\times10^{11}$ cm$^{-2}$ and $5\times10^{13}$ cm$^{-2}$ and at a tilt angle of 7°. Arsenic ions may then be implanted at a higher energy level in a range between about 150–250 KeV and at a dose level in a range between about $8\times10^{11}$ cm$^{-2}$ and $5\times10^{13}$ cm$^{-2}$. The arsenic ions may influence threshold voltage, but typically have a much stronger influence on device characteristics by inhibiting punch-through in the body region of the PMOS device.

Figure 6C:
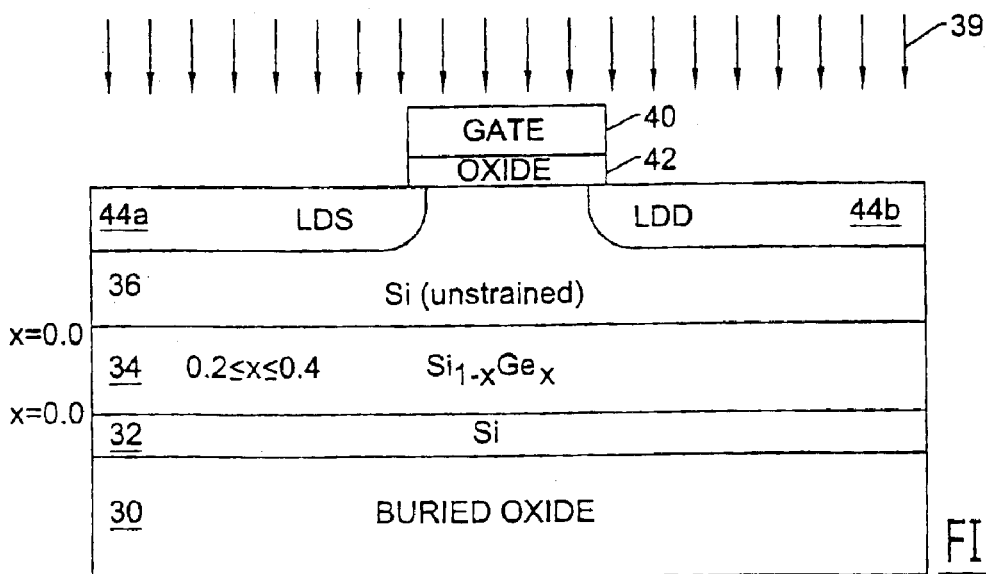

Referring now to FIG. 6C, conventional techniques may then be used to define an insulated gate electrode on the primary surface of the silicon active layer 36. These techniques may include forming a thermal oxide layer 42 on the primary surface and depositing a doped or undoped polysilicon layer 40 on the thermal oxide layer 42. Conventional techniques may then be used to pattern the polysilicon layer and thermal oxide layer into an insulated gate electrode having exposed sidewalls. Techniques for forming insulated gate electrodes are more fully described in commonly assigned U.S. Pat. No. 6,6064,092 to Park, entitled "Semiconductor On-Insulator Substrates Containing Electrically Insulating Mesas"; U.S. Pat. No. 5,998,840 to Kim, entitled "Semiconductor-On-Insulator Field Effect Transistors With Reduced Floating Body Parasitics"; and U.S. Pat. No. 5,877,046 to Yu et al., entitled "Methods of Forming Semiconductor-on-Insulator Substrates", the disclosures of which are hereby incorporated herein by reference. First source and drain region dopants 39 may then be implanted into the silicon active layer 36 to define lightly doped source (LDS) and drain (LDD) regions 44a and 44b. As illustrated, these dopants may implanted in a self-aligned manner using the insulated gate electrode as an implant mask. For a PMOS device, boron dopants (e.g., $BF_2$ ions) may be implanted at an energy level in a range between about 3–30 KeV and at a dose level in a range between about $1 \times 10^{12}$ cm$^{-2}$ and $1 \times 10^{16}$ cm$^{-2}$. Alternatively, for an NMOS device, arsenic dopants may be implanted at an energy level in a range between about 20–50 KeV and at a dose level in a range between about $1 \times 10^{12}$ cm$^{-2}$ and $1 \times 10^{16}$ cm$^{-2}$. A relatively short duration annealing step may then be performed to laterally and vertically diffuse the LDD and LDS dopants. Other dopants may also be used when forming the LDS and LDD regions.

Figure 6D:
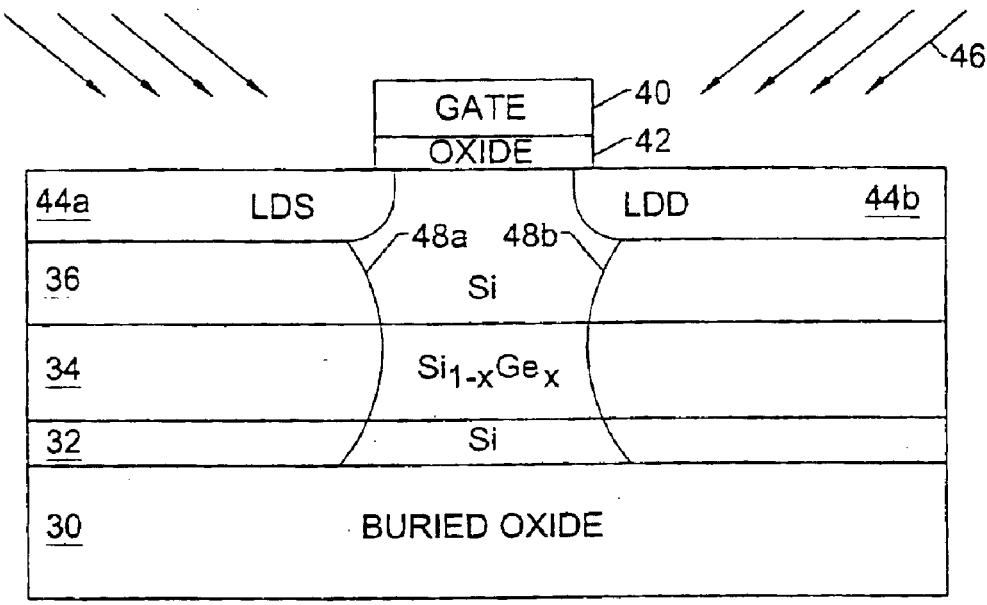
Figure 6E:
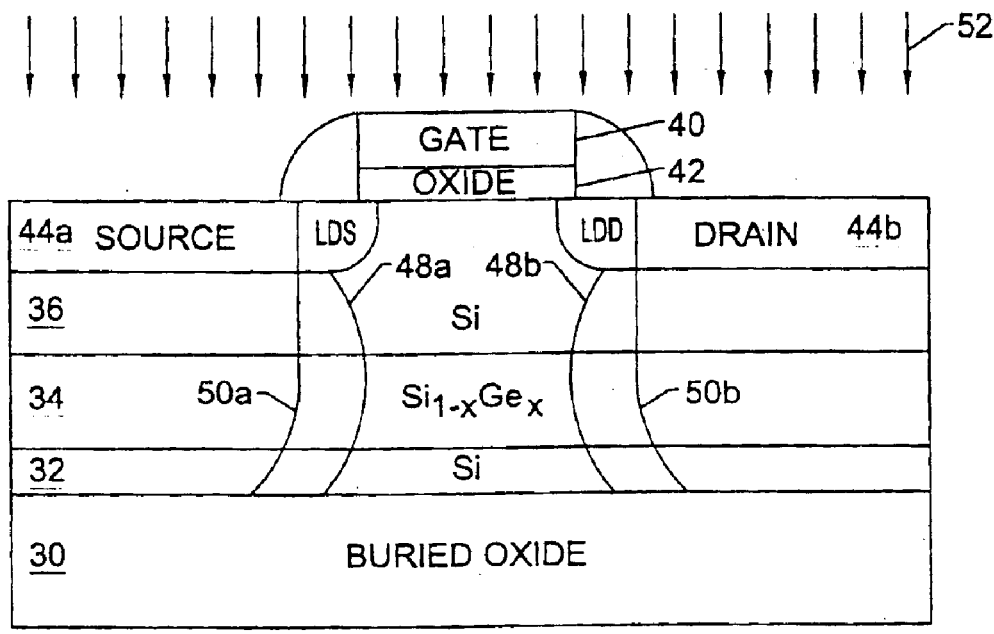

Referring now to FIG. 6D, pocket implant region dopants 46 may then be implanted at a tilt angle in a range between about 7 and 35 degrees, to define P-type pocket implant regions 48a–b within an NMOS device or N-type pocket implant regions 48a–b within a PMOS device. This implant step is preferably performed at a sufficient energy level and dose level to penetrate beneath the LDD and LDS regions 44a and 44b and into the buried $Si_{1-x}Ge_x$ layer 34. In particular, the N-type pocket implant regions 48a–b may be formed by implanting arsenic ions at an energy level in a range between about 100 and 300 KeV and at a dose level in a range between about $1 \times 10^{12}$ cm$^{-2}$ and $1 \times 10^{15}$ cm$^{-2}$. The P-type pocket implant regions 48a–b may also be formed by implanting boron ions at an energy level in a range between about 20 and 60 KeV and at a dose level in a range between about $1 \times 10^{12}$ cm$^{-2}$ and $1 \times 10^{15}$ cm$^{-2}$.

Highly doped N-type source and drain regions 50a and 50b may then be formed by implanting arsenic ions 52 at an energy level in a range between about 20–60 KeV and at a dose level in a range between about $5 \times 10^{14}$ cm$^{-2}$ and $1 \times 10^{17}$ cm$^{-2}$. Alternatively, for a PMOS device, the highly doped P-type source and drain regions 50a and 50b may be formed by implanting $BF_2$ ions 52 at an energy level in a range between about 25–40 KeV and at a dose level in a range between about $1 \times 10^{14}$ cm$^{-2}$ and $5 \times 10^{16}$ cm$^{-2}$. A drive-in and activation step may then be performed by annealing the substrate using a rapid thermal annealing technique. The annealing step may be performed at a temperature in a range between 900° C. and 1050° C., for a duration in a range between 10–200 seconds.

Figure 7A:
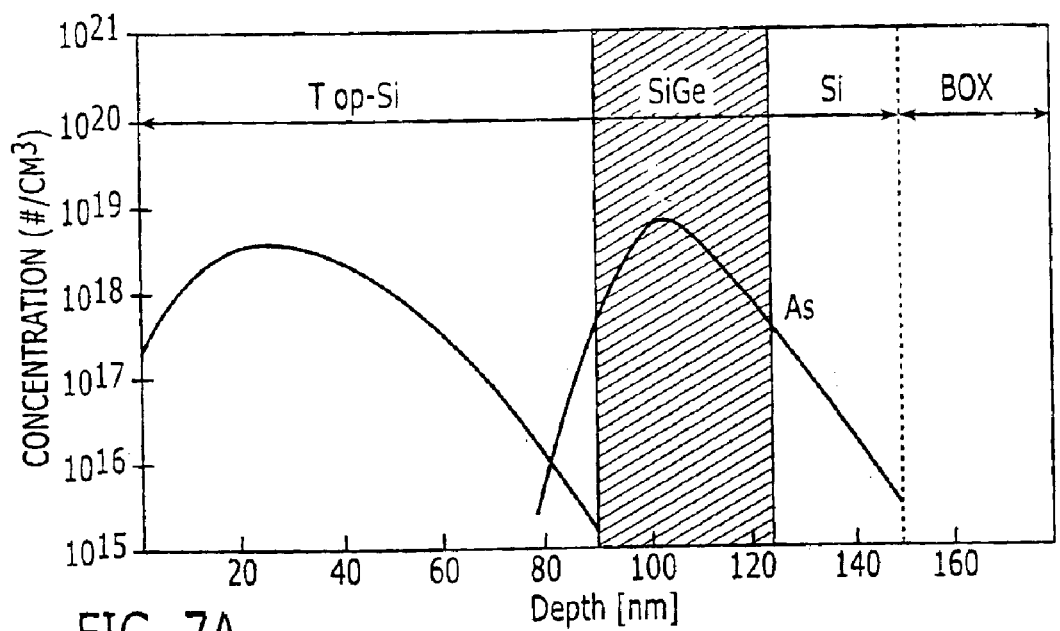
FIG. 7A is a graph of N-type dopant concentration versus substrate depth for a conventional SOI substrate prior to anneal. The illustrated phosphorus and arsenic dopants were implanted at energies of 30 KeV and 200 KeV, respectively.
Figure 7B:
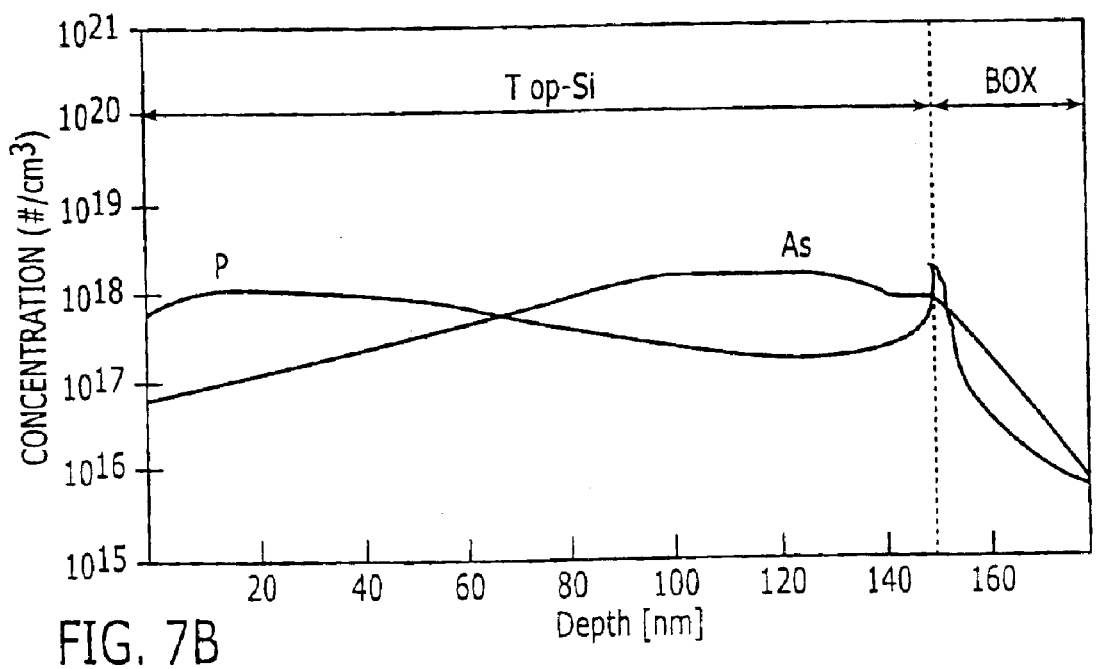
FIG. 7B is a graph of N-type dopant concentration versus substrate depth for a conventional SOI substrate after anneal. The pre-anneal dopant profiles are illustrated by FIG. 7A.
Figure 7C:
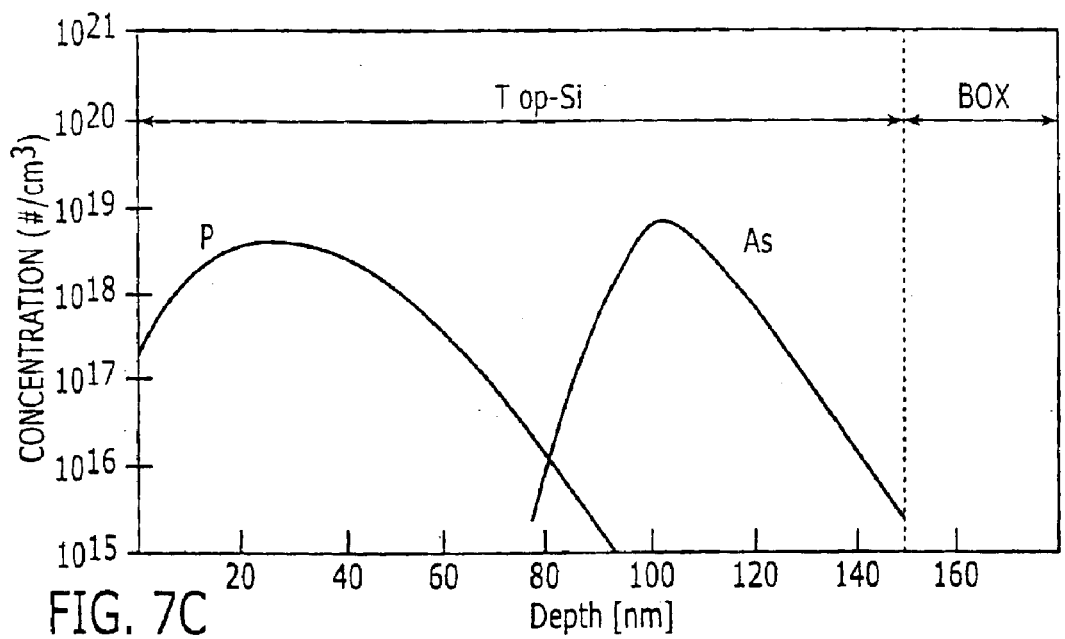
FIG. 7C is a graph of N-type dopant concentration versus substrate depth for a preferred SOI substrate having a SiGe layer inserted therein. The illustrated phosphorus and arsenic dopants were implanted at energies of 30 KeV and 200 KeV, respectively.
Figure 7D:
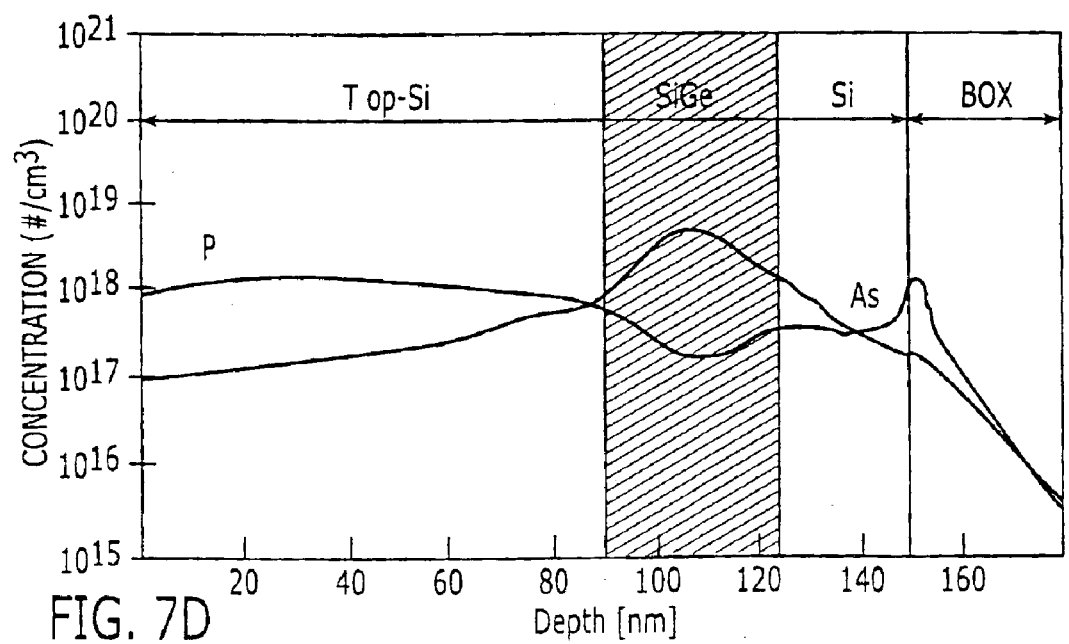
FIG. 7D is a graph of N-type dopant concentration versus substrate depth for a preferred SOI substrate having a SiGe layer inserted therein, after anneal. The pre-anneal dopant profiles are illustrated by FIG. 7C.

Referring now to FIGS. 7A–7D, pre-anneal and post-anneal profiles of N-type dopants in conventional SOI substrates and SOI substrates having SiGe layers inserted therein will be described. In particular, FIG. 7A illustrates doping profiles for phosphorus (P) and arsenic (As) in a conventional SOI substrate having a buried oxide layer (BOX) extending therein between a silicon active layer (top-Si) and a silicon wafer (not shown). The illustrated phosphorus and arsenic dopants were implanted at energies of 30 KeV and 200 KeV, respectively. As illustrated by FIG. 7B, after performing a rapid thermal anneal (RTA) at a temperature of about 1000° C. and a duration of about 30 seconds, the original gaussian-shaped doping profiles spread out and give rise to substantially uniform profiles. In contrast, the doping profiles illustrated by FIGS. 7C and 7C show that a retrograded As profile can be achieved in a SOI substrate having a buried $Si_{1-x}Ge_x$ layer therein formed in accordance with methods of the present invention. This retrograded profile is achieved, in part, by doping the buried $Si_{1-x}Ge_x$ layer with a sufficient concentration of Ge to substantially increase the dopant solubility of arsenic in the $Si_{1-x}Ge_x$ layer relative to the silicon active layer. In particular, FIG. 7C illustrates pre-anneal phosphorus and arsenic profiles (phosphorus and arsenic dopants were implanted at energies of 30 KeV and 200 KeV, respectively) and FIG. 7D illustrates post-anneal profiles. As with FIG. 7B, the rapid thermal annealing step was performed at a temperature of about 1000° C. and a duration of about 30 seconds. As illustrated by FIG. 7D, the arsenic profile decreases monotonically from a peak concentration level of $1 \times 10^{19}$ cm$^{-3}$ within the buried $Si_{1-x}Ge_x$ layer to a minimum concentration level of $1 \times 10^{17}$ cm$^{-3}$ at the surface of the substrate. Depending on the profile and concentration of the phosphorus dopants in the silicon active layer, the combined profile of the P and As dopants may also be retrograded across the silicon active layer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor-on-insulator field effect transistor, comprising:
   an electrically insulating layer;
   an unstrained silicon active layer on said electrically insulating layer;
   an insulated gate electrode on a surface of said unstrained silicon active layer; and
   a $Si_{1-x}Ge_x$ layer disposed between said electrically insulating layer and said unstrained silicon active layer, said $Si_{1-x}Ge_x$ layer forming a first junction with said unstrained silicon active layer and having a graded concentration of Ge therein that decreases monotonically in a first direction extending from a peak level towards the surface.

2. The transistor of claim 1, wherein the peak level is greater than x=0.15; and wherein the concentration of Ge in said $Si_{1-x}Ge_x$ layer varies from the peak level to a level less than about x=0.1 at the first junction.

3. The transistor of claim 2, wherein the concentration of Ge in said $Si_{1-x}Ge_x$ layer varies from the peak level where 0.2<x<0.4 to a level where x=0 at the first junction.

4. A semiconductor-on-insulator field effect transistor, comprising:
   an electrically insulating layer;
   a composite semiconductor active region on said electrically insulating layer, said composite semiconductor active region comprising an unstrained silicon active layer having a thickness greater than about 600 Å and a single $Si_{1-x}Ge_x$ layer disposed between said electrically insulating layer and said silicon active layer, said $Si_{1-x}Ge_x$ layer forming a first junction with said silicon active layer and having a graded concentration of Ge therein that decreases monotonically in a first direction extending from a peak level towards a surface of said silicon active layer; and an insulated gate electrode on the surface.

5. The transistor of claim 4, wherein the peak level is greater than x=0.15; and wherein the concentration of Ge in said $Si_{1-x}Ge_x$ layer varies from the peak level to a level less than about x=0.1 at the first junction.

6. The transistor of claim 5, wherein the concentration of Ge in said $Si_{1-x}Ge_x$ layer varies from the peak level where 0.2<x<0.4 to a level where x=0 at the first junction.

7. A PMOS field effect transistor, comprising:

a composite semiconductor active region on an electrically insulating layer, said composite semiconductor active region comprising a single $Si_{1-x}Ge_x$ layer having a graded concentration of Ge therein that decreases monotonically in a first direction extending from a peak level within the single $Si_{1-x}Ge_x$ layer towards a surface of said composite semiconductor layer and a silicon active layer that extends from a first junction with the single $Si_{1-x}Ge_x$ layer to the surface, said composite semiconductor active region having a retrograded N-type dopant profile therein with a minimum level adjacent the surface and a peak level in the single $Si_{1-x}Ge_x$ layer; and an insulated gate electrode on the surface.

8. The transistor of claim 7, wherein the silicon active layer has a thickness greater than about 600 Å and has an unstrained region therein adjacent the surface.

9. The transistor of claim 8, further comprising:

lightly doped P-type source and drain regions that extend in the silicon active layer and opposite the insulated gate electrode; and a source-side pocket implant region of N-type conductivity that extends between said lightly doped P-type source region and the single $Si_{1-x}Ge_x$ layer and forms rectifying and nonrectifying junctions therewith, respectively.

10. An enhancement-mode field effect transistor, comprising:

an electrically insulating layer;

a silicon active layer on said electrically insulating layer;

an insulated gate electrode on a surface of said silicon active layer;

a $Si_{1-x}Ge_x$ epitaxial layer disposed between said electrically insulating layer and said silicon active layer, said $Si_{1-x}Ge_x$ epitaxial layer forming a first junction with said silicon active layer;

lightly doped source and drain regions of first conductivity type in said silicon active layer; and a source-side pocket implant region of second conductivity type that extends between said lightly doped source region and said $Si_{1-x}Ge_x$ epitaxial layer and forms rectifying and non-rectifying junctions therewith.

11. The transistor of claim 10, wherein said $Si_{1-x}Ge_x$ epitaxial layer has a graded concentration of Ge therein that decreases in a direction from said electrically insulating layer to said insulated gate electrode.

12. The transistor of claim 11, wherein said $Si_{1-x}Ge_x$ epitaxial layer has a retrograded N-type dopant profile therein.

13. The transistor of claim 12, wherein said silicon active layer has a thickness greater than about 600 Å.

14. A semiconductor-on-insulator substrate, comprising:

a silicon wafer having an electrically insulating layer thereon;

a $Si_{1-x}Ge_x$ layer having a graded concentration of Ge therein extending on the electrically insulating layer; and an unstrained silicon active layer extending on and forming a non-rectifying junction with the $Si_{1-x}Ge_x$ layer and extending to a surface of the semiconductor-on-insulator substrate.

15. The substrate of claim 14, wherein said $Si_{1-x}Ge_x$ layer is epitaxially grown from said unstrained silicon active layer.

16. The substrate of claim 15, wherein said unstrained silicon active layer has a thickness greater than about 600 Å.

17. A method of forming a field effect transistor, comprising the steps of:

forming an insulated gate electrode on a surface of a semiconductor-on-insulator substrate that comprises an electrically insulating layer, an unstrained silicon active layer on the electrically insulating layer and a $Si_{1-x}Ge_x$ epitaxial layer having a graded concentration of Ge therein disposed between the electrically insulating layer and the unstrained silicon active layer;

forming source and drain regions of first conductivity type in the unstrained silicon active layer; and forming source-side and drain-side pocket implant regions of second conductivity type that extend in the unstrained silicon active layer and in the $Si_{1-x}Ge_x$ epitaxial layer and form respective P-N junctions with the source and drain regions.

18. The method of claim 17, wherein the unstrained silicon active layer has a thickness greater than about 600 Å.

19. A semiconductor-on-insulator field effect transistor, comprising:

a bulk silicon region;

an electrically insulating layer on said bulk silicon region;

an unstrained silicon active layer having a first thickness on said electrically insulating layer;

an insulated gate electrode on a surface of said unstrained silicon active layer;

sidewall insulating spacers on said insulated gate electrode;

a $Si_{1-x}Ge_x$ layer of first conductivity type disposed between said electrically insulating layer and said unstrained silicon active layer, said $Si_{1-x}Ge_x$ layer forming a first junction with said unstrained silicon active layer and having a graded concentration of Ge therein that decreases monotonically in a first direction extending from a peak level towards the surface;

lightly doped source and drain regions of second conductivity type extending in said unstrained silicon active layer and having a thickness less than the first thickness; and a source-side pocket implant region of first conductivity type in said unstrained silicon active layer, said source-side pocket implant region extending between said lightly doped source region and said $Si_{1-x}Ge_x$ layer.

* * * * *